(12) United States Patent
Kim et al.

(10) Patent No.: US 8,536,553 B2
(45) Date of Patent: Sep. 17, 2013

(54) APPARATUS AND METHOD FOR DETECTING RADIATION

(75) Inventors: Jung-Seok Kim, Gwangju-si (KR);
 Byung-Hun Ko, Seongnam-si (KR);
 Beom-Jin Moon, Suwon-si (KR);
 Jung-Kee Yoon, Anyang-si (KR)

(73) Assignee: DRTECH Corporation, Seongnam-si (KR)

( * ) Notice: Subject to any disclaimer, the term of this patent is extended or adjusted under 35 U.S.C. 154(b) by 365 days.

(21) Appl. No.: 12/957,852

(22) Filed: Dec. 1, 2010

(65) Prior Publication Data
 US 2012/0080604 A1   Apr. 5, 2012

(30) Foreign Application Priority Data
 Sep. 30, 2010   (KR) .................. 10-2010-0095572

(51) Int. Cl.
 *G01T 1/24*   (2006.01)
(52) U.S. Cl.
 USPC ......................................... 250/591
(58) Field of Classification Search
 CPC ...................................... G01T 1/246
 USPC ......................................... 250/591
 See application file for complete search history.

(56) References Cited

U.S. PATENT DOCUMENTS

| 7,488,966 | B2 | 2/2009 | Noda et al. | |
| 7,791,037 | B1* | 9/2010 | Wedding et al. | 250/374 |
| 2006/0065865 | A1* | 3/2006 | Hakamata | 250/591 |

FOREIGN PATENT DOCUMENTS

| JP | 2000-287034 | 10/2000 |
| JP | 2005-033002 | 2/2005 |
| JP | 2005-268722 | 9/2005 |
| JP | 2007-059798 | 3/2007 |
| KR | 10-2002-0061391 | 7/2002 |
| KR | 10-2003-0089674 | 11/2003 |
| KR | 10-2008-0056641 A | 6/2008 |
| KR | 10-2010-0026706 | 3/2010 |

* cited by examiner

*Primary Examiner* — Constantine Hannaher
(74) *Attorney, Agent, or Firm* — NSIP Law

(57) ABSTRACT

An apparatus and method for detecting radiation are provided. The apparatus includes an upper electrode layer transmitting radiation; a first insulating layer blocking charges from the upper electrode layer; a photoconductive layer becoming photoconductive upon exposure to the radiation; a second insulating layer protecting the photoconductive layer from a plasma discharge; a lower substrate facing the second insulating layer; a plurality of barrier ribs defining a cell structure between the second insulating layer and the lower substrate; a gas layer included in an inner chamber inside the cell structure and generating a plasma discharge; a bottom electrode formed on the lower substrate; a first radio frequency (RF) electrode formed over the bottom electrode and connected to a ground source; a second RF electrode to which RF power for generating plasma is applied; and a third insulating layer surrounding the first and second RF electrodes and thus insulating the first and second RF electrodes from the gas layer and the bottom electrode.

17 Claims, 12 Drawing Sheets

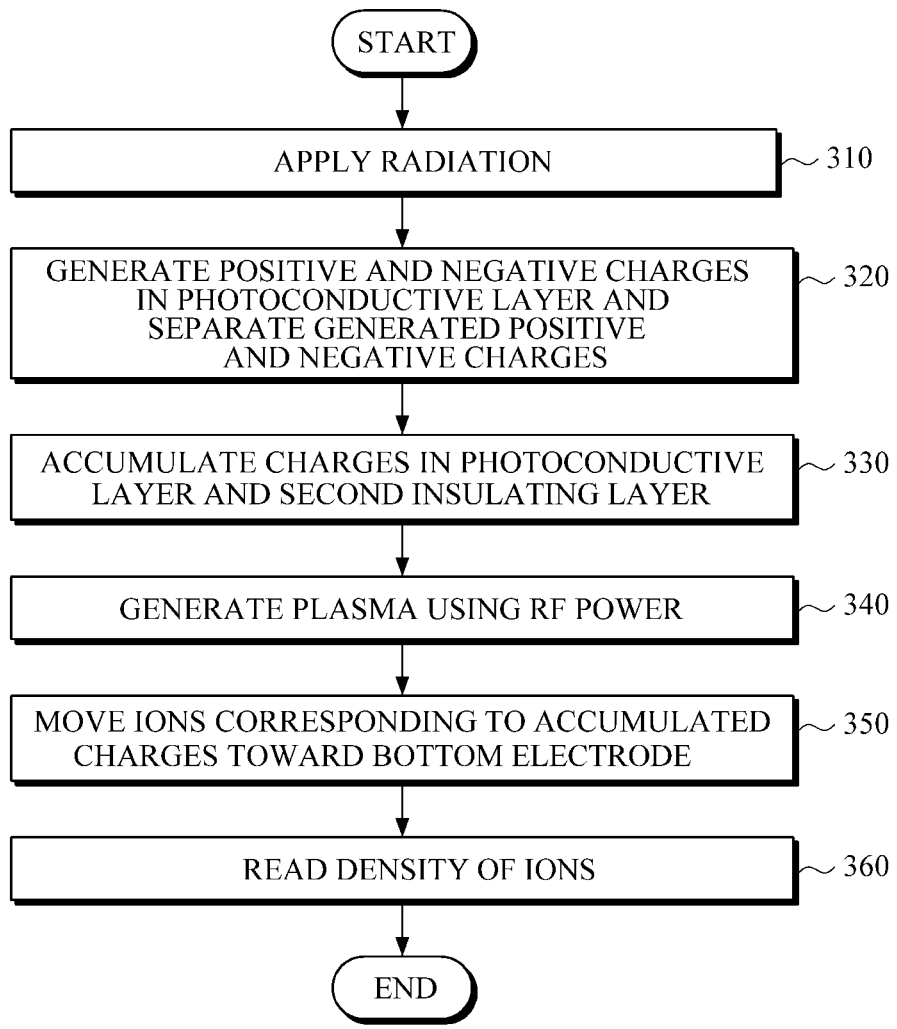

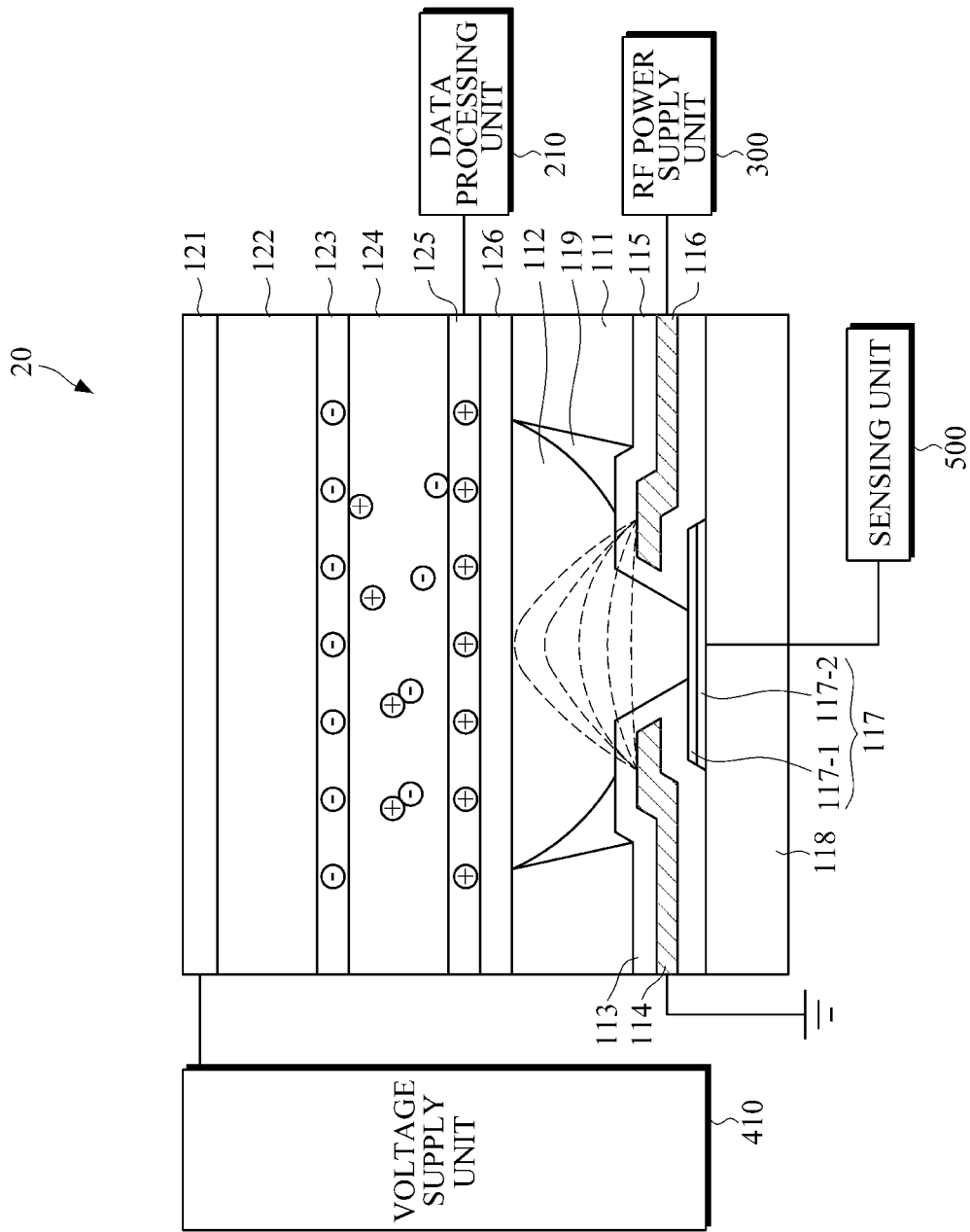

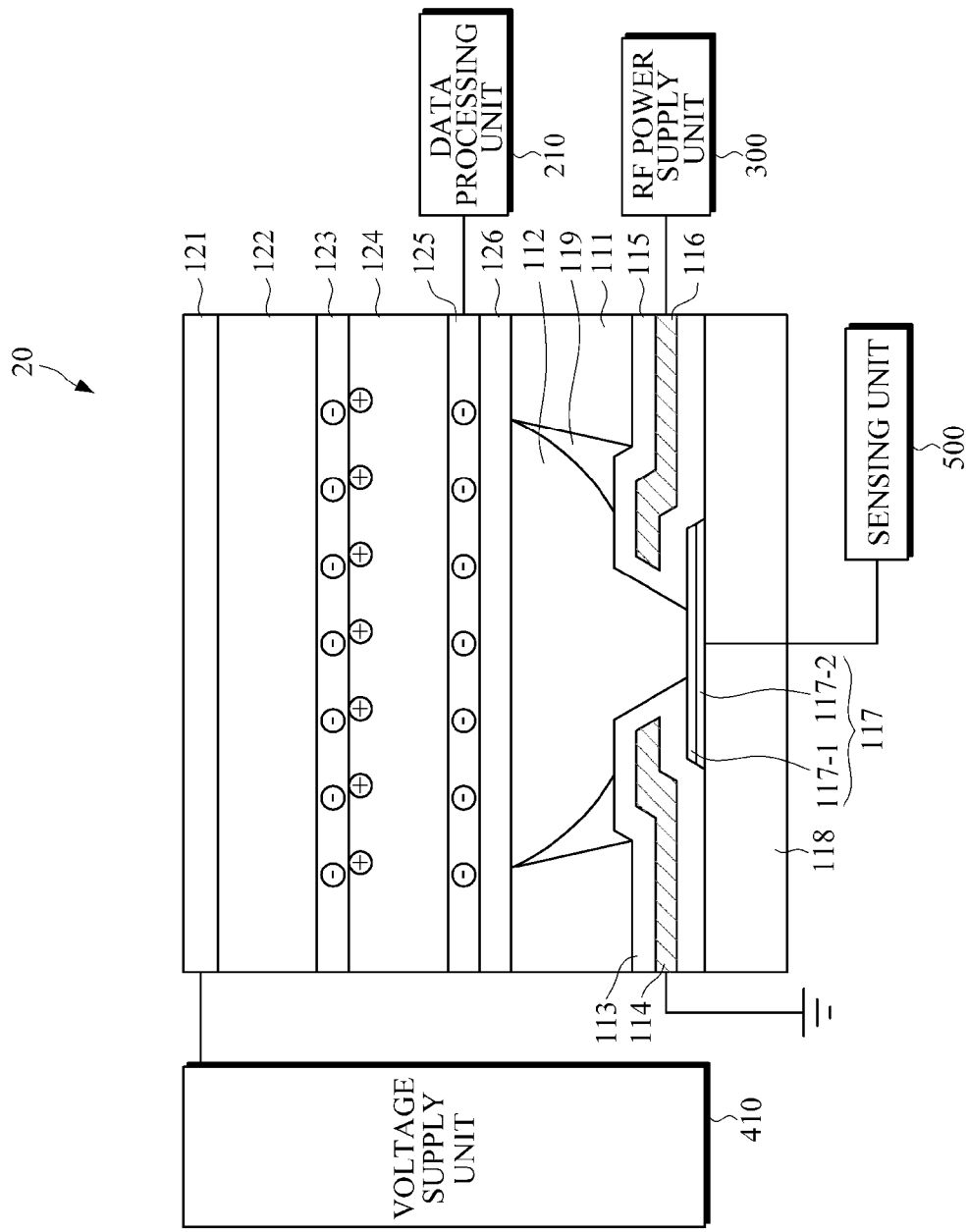

APPARATUS AND METHOD FOR DETECTING RADIATION

CROSS-REFERENCE TO RELATED APPLICATION(S)

This application claims the benefit under 35 U.S.C. §119 (a) of Korean Patent Application No. 10-2010-0095572, filed on Sep. 30, 2010, in the Korean Intellectual Property Office, the entire disclosure of which is incorporated herein by reference for all purposes.

BACKGROUND

1. Field

The following description relates to an apparatus and method for detecting radiation, which can detect radiation such as X-rays and can thus generate image data.

2. Description of the Related Art

Digital radiation detection apparatuses are devices that obtain information on the inside of the human body through X-ray irradiation without a requirement of films, detect electric image signals from the obtained information with the use of image detection sensors and generate a digital image based on the electrical image signals. Digital radiation detection apparatuses are largely classified into direct-type and indirect-type digital radiation detection apparatuses. Direct-type digital radiation detection apparatuses directly detect electric signals generated by irradiating the human body using amorphous selenium (a-Se) and thin film transistors (TFTs). Indirect-type digital radiation detection apparatuses use light receptors such as charge-coupled deices (CCDs) or photodiodes and thus obtain radiation images from light emitted by phosphors (such as CsI) that convert radiation into visible light. Indirect-type digital radiation detection apparatuses have a relatively low resolution, compared to direct-type digital radiation detection apparatuses.

Conventional radiation detection apparatuses using TFTs are likely to result in a considerable amount of noise. The greater the size of radiation detection apparatuses, the greater the amount of noise generated, and the lower the detective quantum efficiency. In addition, since a TFT is required for each pixel in a panel, radiation detection apparatuses are generally difficult and costly to manufacture on a large scale.

SUMMARY

The following description relates to an apparatus and method for detecting radiation, which can improve the resolution of images.

In one general aspect, there is provided an apparatus for detecting radiation, the apparatus including an upper electrode layer transmitting radiation; a first insulating layer blocking charges from the upper electrode layer; a photoconductive layer becoming photoconductive upon exposure to the radiation; a second insulating layer protecting the photoconductive layer from a plasma discharge; a lower substrate facing the second insulating layer; a plurality of barrier ribs defining a cell structure between the second insulating layer and the lower substrate; a gas layer included in an inner chamber inside the cell structure and generating a plasma discharge; a bottom electrode formed on the lower substrate; a first radio frequency (RF) electrode formed over the bottom electrode and connected to a ground source; a second RF electrode to which RF power for generating plasma is applied; and a third insulating layer surrounding the first and second RF electrodes and thus insulating the first and second RF electrodes from the gas layer and the bottom electrode.

In another general aspect, there is provided a method of detecting radiation, which is an operating method of an apparatus for detecting radiation, including an upper electrode layer transmitting radiation, a first insulating layer blocking charges from the upper electrode layer, a photoconductive layer becoming photoconductive upon exposure to the radiation, a second insulating layer protecting the photoconductive layer from a plasma discharge, a lower substrate facing the second insulating layer, a plurality of barrier ribs defining a cell structure between the second insulating layer and the lower substrate, a gas layer included in an inner chamber inside the cell structure and generating a plasma discharge, a bottom electrode formed on the lower substrate, a first RF electrode formed over the bottom electrode and connected to a ground source, a second RF electrode to which RF power for generating plasma is applied and a third insulating layer surrounding the first and second RF electrodes and thus insulating the first and second RF electrodes from the gas layer and the bottom electrode, the method including generating pairs of positive and negative charges in the photoconductive layer upon exposure to the radiation; accumulating the positive or negative charges between the photoconductive layer and the second insulating layer in response to a high voltage applied to the upper electrode layer; generating plasma in the gas layer in response to RF power to the second RF electrode; allowing positive or negative ions, which are generated due to the plasma generated in the gas layer, to accumulate in the bottom electrode in response to the positive or negative charges accumulated between the photoconductive layer and the second insulating layer; and reading a density of positive or negative ions accumulated in the bottom electrode.

In another general aspect, there is provided a method of detecting radiation, which is an operating method of an apparatus for detecting radiation, including an upper electrode layer transmitting radiation, a first photoconductive layer becoming photoconductive upon exposure to the radiation, a charge trapping layer trapping charges generated in the first photoconductive layer, a second photoconductive layer becoming photoconductive upon exposure to rear light, a lower transparent electrode layer charged with the charges trapped in the charge trapping layer and used to read out charges generated in the second photoconductive layer, a first insulating layer protecting the lower transparent electrode layer from a plasma discharge, a lower substrate facing the first insulating layer, a plurality of barrier ribs defining a cell structure between the second insulating layer and the lower substrate, a gas layer included in an inner chamber inside the cell structure and generating a plasma discharge, a bottom electrode formed on the lower substrate, a first RF electrode formed over the bottom electrode and connected to a ground source, a second RF electrode to which RF power for generating plasma is applied, and a third insulating layer surrounding the first and second RF electrodes and thus insulating the first and second RF electrodes from the gas layer and the bottom electrode, the method including generating pairs of positive and negative charges in the photoconductive layer upon exposure to the radiation when a high voltage is applied to the upper electrode layer; separating the positive and negative charges from each other by moving the positive and negative charges toward the upper electrode and the charge trapping layer, respectively; trapping the positive or negative charges in the charge trapping layer; generating plasma light by applying RF power to the second RF electrode; generating pairs of positive and negative charges in the second photoconductive layer upon exposure to the plasma light; reading out a signal corresponding to charges transmitted from the second photoconductive layer to the lower transparent electrode layer in connection with the charges trapped in the charge trapping layer from the lower transparent electrode layer; and generating a radiation image based on the read-out signal.

Other features and aspects may be apparent from the following detailed description, the drawings, and the claims.

BRIEF DESCRIPTION OF THE DRAWINGS

FIG. 3 is a flowchart of an example method of detecting radiation;

FIG. 5A through 5D are cross-sectional views for explaining a radiation detection operation performed by the apparatus shown in FIG. 4;

Figure 1:
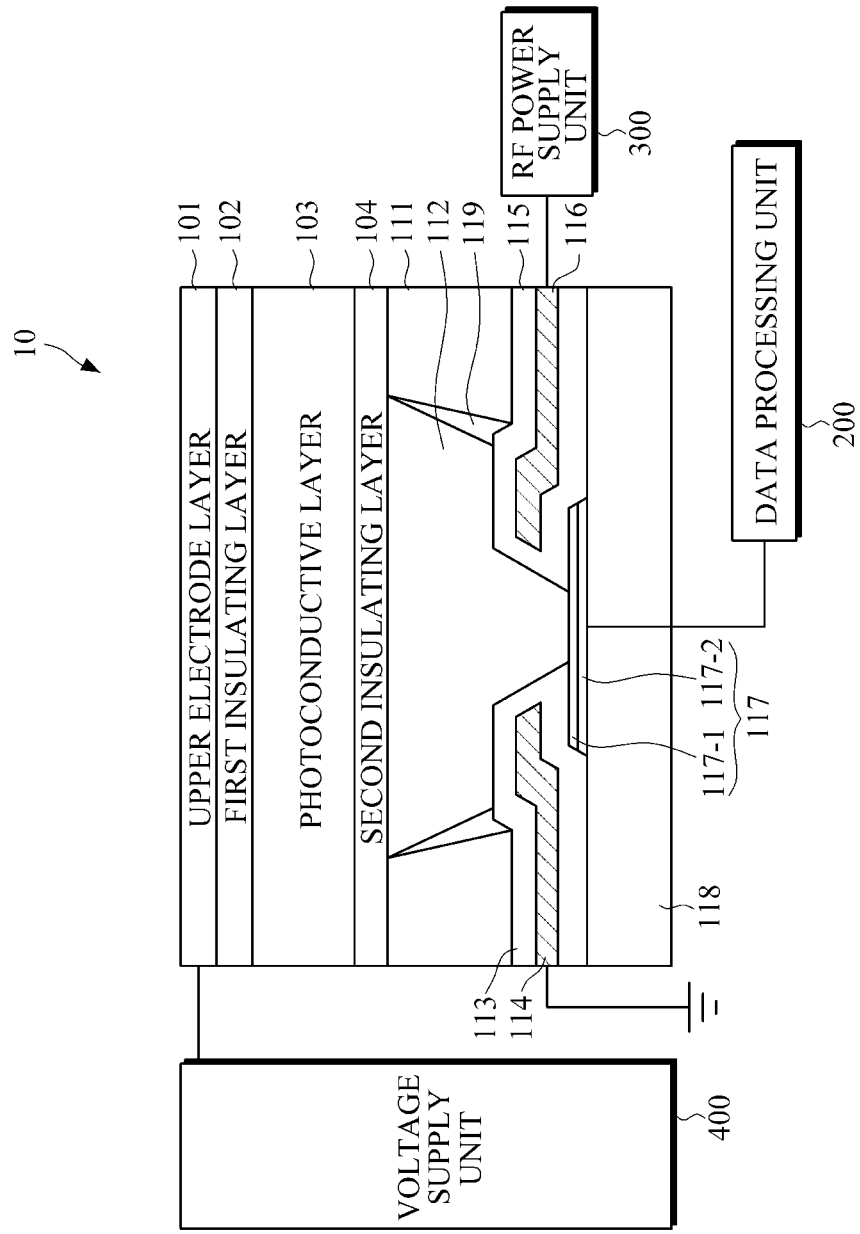
FIG. 1 is a cross-sectional view of an example apparatus for detecting radiation.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

FIG. 1 is a cross-sectional view of an example apparatus 10 for detecting radiation. Referring to FIG. 1, the apparatus 10 may include an upper electrode layer 101, a second insulating layer 102, a photoconductive layer 103, a second insulating layer 104, and a plasma generator.

The upper electrode layer 101 may transmit radiation. The term 'radiation,' as used herein, includes, but is not limited to, X-rays, alpha rays and gamma rays.

The first insulating layer 102 may prevent charges from infiltrating into the photoconductive layer 103 from the upper electrode layer 101 when a high voltage is applied to the upper electrode layer 101.

The photoconductive layer 103 may become photoconductive upon exposure to the radiation transmitted by the upper electrode layer 101. The photoconductive layer 103 may generate pairs of positive and negative charges (i.e., holes and electrons) upon exposure to the radiation transmitted by the upper electrode layer 101. The number of pairs of positive and negative charges generated by the photoconductive layer 103 may be proportional to the intensity of the radiation transmitted to the photoconductive layer 103. The amount of radiation that reaches the photoconductive layer 103 may vary according to the composition of an object (such as the human body), if any, placed on the upper electrode layer 101. The photoconductive layer 103 may be formed of amorphous selenium (a-Se), $As_2Se_3$ or an asbestos (As)-contained a-Se compound.

The second insulating layer 104 may protect the photoconductive layer 103 against plasma discharges. The plasma generator may include a plurality of barrier ribs 111, a gas layer 112, first and second radio frequency (RF) electrodes 114 and 116, third insulating layers 113 and 115, a bottom electrode 117, a lower substrate 118 and a phosphor layer 119.

The lower substrate 118 may face the second insulating layer 104.

The gas layer 112 may be disposed in an inner chamber within the cell structure formed by each of the barrier ribs 111, and may generate a plasma discharge. Plasma light generated by the gas layer 112 may be provided to the photoconductive layer 103 via the second insulating layer 104.

The barrier ribs 111 may define a cell structure between the second insulating layer 104 and the lower substrate 118. More specifically, the barrier ribs 111 may be formed between the second insulating layer 104 and the third insulating layers 113 and 115 and may thus form a sealed cell structure. The barrier ribs 111 may define a plurality of pixels in the plasma generator. The barrier ribs 111 may prevent crosstalk between the pixels. The barrier ribs 111 may be formed in various shapes such as 2-, 6-, and 8-directional shapes according to a desired shape of pixels. The barrier ribs 111 may determine the resolution of the apparatus 10. The barrier ribs 111 may be formed using the same method used to manufacture a typical PDP. The area and height of the barrier ribs 111 can be appropriately adjusted in order to increase the reaction area of each pixel for radiation.

The bottom electrode 117 may be formed on the lower substrate 118. The bottom electrode 117 may include a quartz layer 117-1 and an electrode layer 117-2. The quartz layer 117-1 may contact the gas layer 112. The electrode layer 117-2 may contact the lower substrate 118, and may be connected to a data processing unit 200.

The first and second RF electrodes 114 and 116 may be formed over the bottom electrode 117. The first RF electrode 114 may be connected to a ground source. The second RF electrode 116 may be supplied with RF power by an RF power supply unit 300. Due to the RF power supplied to the second RF electrode 116, plasma may be generated in the gas layer 112. Since two RF electrodes (i.e., the first and second RF electrodes 114 and 116) are provided for each pixel, it is possible to effectively generate plasma.

The third insulating layers 113 and 115 may surround the first and second RF electrodes 114 and 116, respectively, and may thus insulate the first and second RF electrodes 114 and 116 from the gas layer 112 and the bottom electrode 117. The phosphor layer 119 may extend to the third insulating layers 113 and 115, and may surround the gas layer 112 along the barrier ribs 111. The phosphor layer 119 may reflect plasma light generated by the gas layer 112 and may thus increase the intensity of the plasma light. The phosphor layer 119 may be optional.

The data processing unit 200 may be connected to the bottom electrode 117. The data processing unit 200 may calculate the density of positive or negative ions accumulated in the bottom electrode 117 based on the oscillation period of a resonant frequency generated in the quartz layer 117-1, and may generate a radiation image based on the result of the calculation. More specifically, ions generated in the gas layer 112 upon the generation of plasma in the gas layer 112 may collide with the surface of the quartz layer 117-1. The resonant frequency of the quartz layer 117-1 may be given in advance, and an oscillation period, which is the interval between two successive oscillation peaks of the resonant frequency of the quartz layer 117-1, may be determined by the density of ions colliding with the quartz layer 117-1. Thus, the oscillation frequency detected from the quartz layer 117-1 during a predetermined sensing period may be transmitted to the data processing unit 200 via the electrode layer 117-2. Then, the data processing unit 200 may determine the oscillation period based on the oscillation frequency provided thereto, and may calculate the density of ions colliding with the quartz layer 117-1 based on the determined oscillation period.

Once the apparatus 10 absorbs X-rays for generating a radiation image, an amount of charges corresponding to the amount of X-rays absorbed by the apparatus 10 may be generated in the apparatus 10, and the generated charges may accumulate between the photoconductive layer 103 and the first insulating layer 102 and between the photoconductive layer 103 and the second insulating layer 104. Therefore, it is necessary to reset the photoconductive layer 103 to a neutral state between two successive image capturing operations.

It generally takes several to dozens of seconds to reset the apparatus 10 for another image capture operation using a rear light device, which results delays in the capturing of images and thus causes inconvenience not only to patients but also to radiographers. If the photoconductive layer 103 is exposed to too much light in order to electrically reset the apparatus 10, the electrical performance of the photoconductive layer 103 may deteriorate, and the life span of the apparatus 10 may decrease due to cumulative damage to the photoconductive layer 103.

When the reading out of the charges accumulated in the bottom electrode 117 is complete, the RF power supply unit 300 may supply RF power to the second RF electrode 116 in order for the second RF electrode 116 to reset the photoconductive layer 103 and thus to electrically neutralize the photoconductive layer 103. More specifically, the RF power supply unit 300 may supply an RF power of, for example, 2 kW (frequency: 13.56 MHz), to the second RF electrode 116 during an image sensing period for generating a radiation image and may thus be able to reset the photoconductive layer 103. In this manner, by using plasma light, it is possible to not only read out a radiation image but also reset the photoconductive layer 103.

The RF power supply unit 300 may control the intensity of rear light, i.e., plasma light, by adjusting the level of RF power to be supplied to the second RF electrode 116. The RF power supply unit 300 may also control the duration of exposure to plasma light, which is generated upon the supply of RF power. Therefore, the RF power supply unit 300 can control the amount of plasma light generated by appropriately controlling the intensity of plasma light and the duration of exposure to the plasma light.

FIG. 1 illustrates the structure of a portion of the apparatus 10 corresponding to a pixel in the plasma generator. Referring to FIG. 1, since the amount of radiation absorbed by each pixel varies according to the brightness of a corresponding pixel, the amount of rear light required to reset the photoconductive layer 103 may vary from one pixel to another. Thus, the RF power supply unit 300 may adjust the level of RF power and the duration of exposure to plasma light in units of pixels based on pixel brightness measurements provided by the data processing unit 200 such that a smaller amount of rear light can be applied to pixels with a low brightness level than pixels with a high brightness level.

In this manner, it is possible to reduce the time taken to reset the apparatus 10 between two successive image capturing operations by adjusting, in units of pixels, the amount of plasma light irradiated on the photoconductive layer 103 for resetting the photo conductive layer 103. In addition, it is possible to prevent the photoconductive layer 103 from being exposed to too much plasma light and thus to prevent the life span of the photoconductive layer 103 from decreasing due to cumulative fatigue.

A voltage supply unit 400 may apply a high voltage or a ground voltage to the upper electrode layer 101 according to the type of operation performed by the apparatus 10.

Figure 2A:
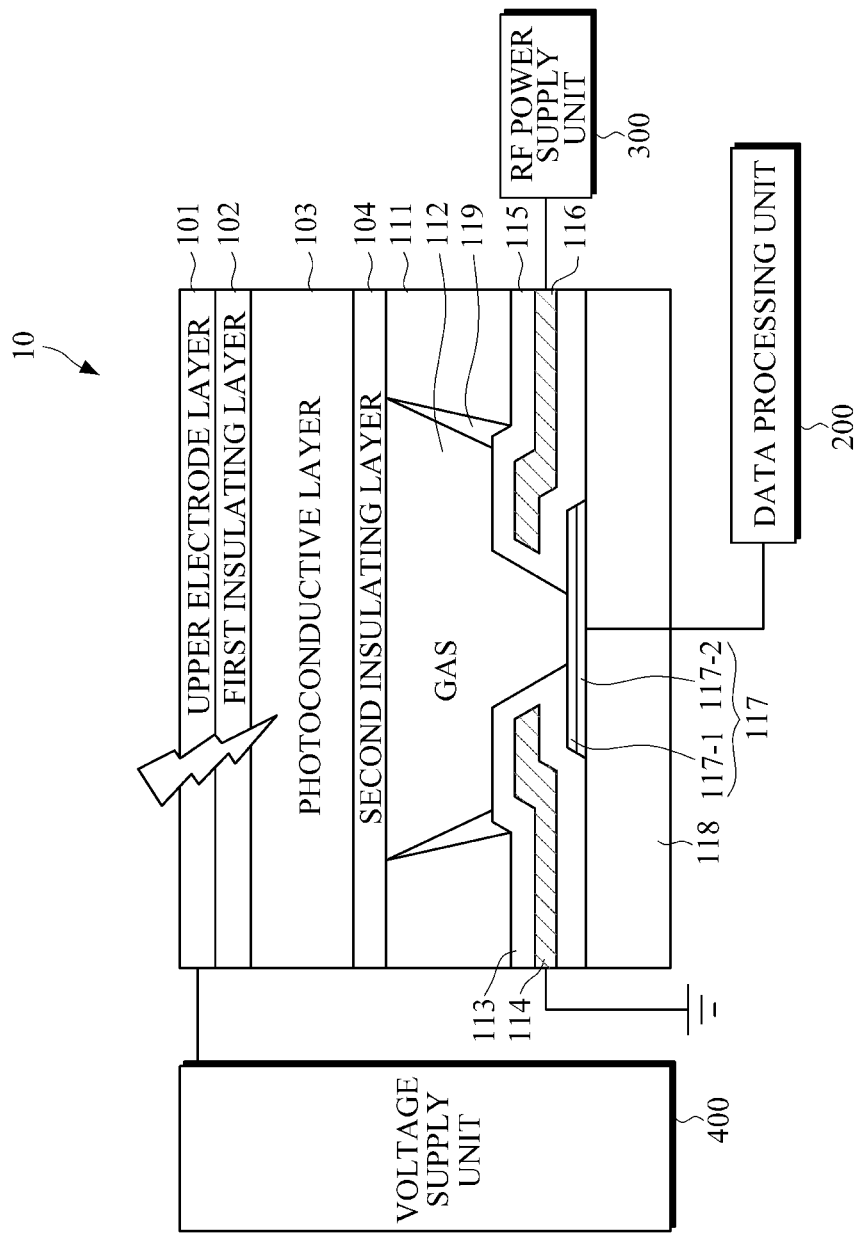
FIGS. 2A through 2C are cross-sectional views for explaining a radiation detection operation performed by the apparatus shown in FIG. 1.
Figure 2B:
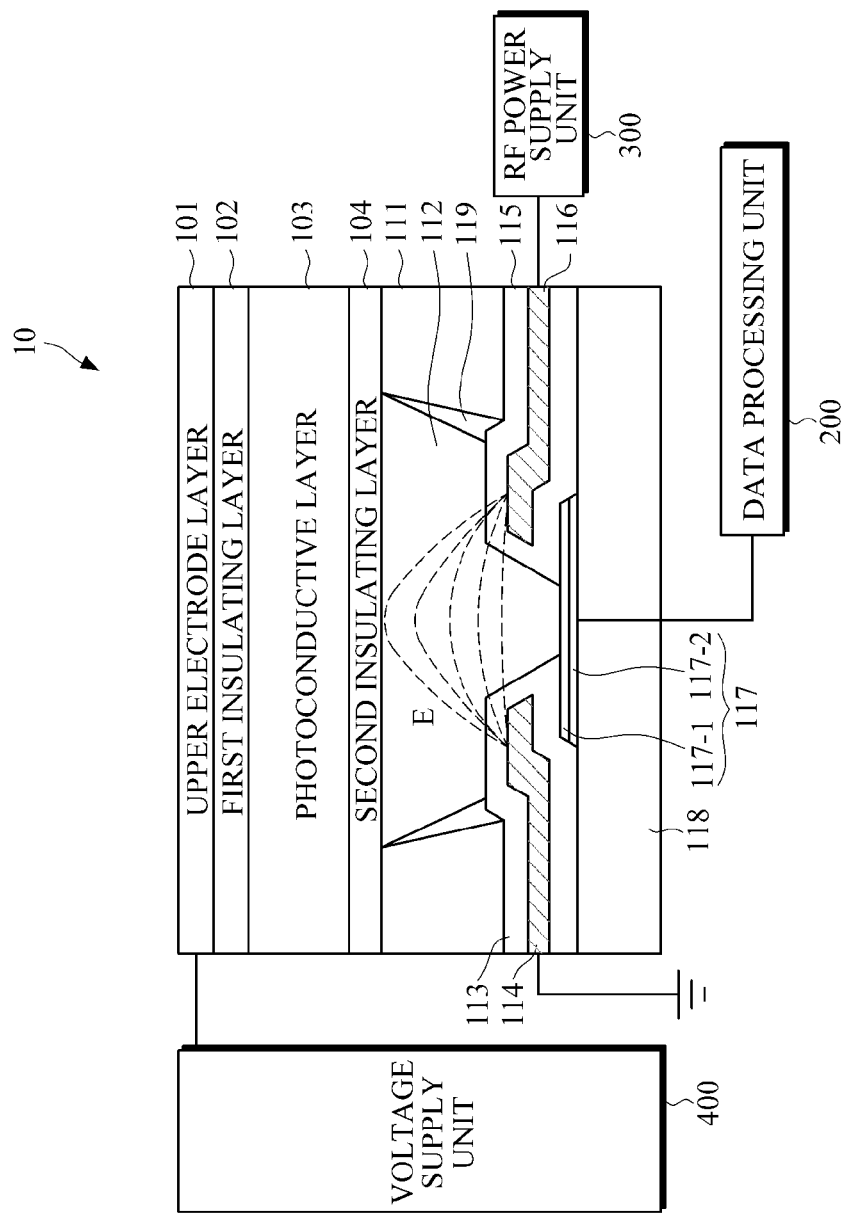
Figure 2C:
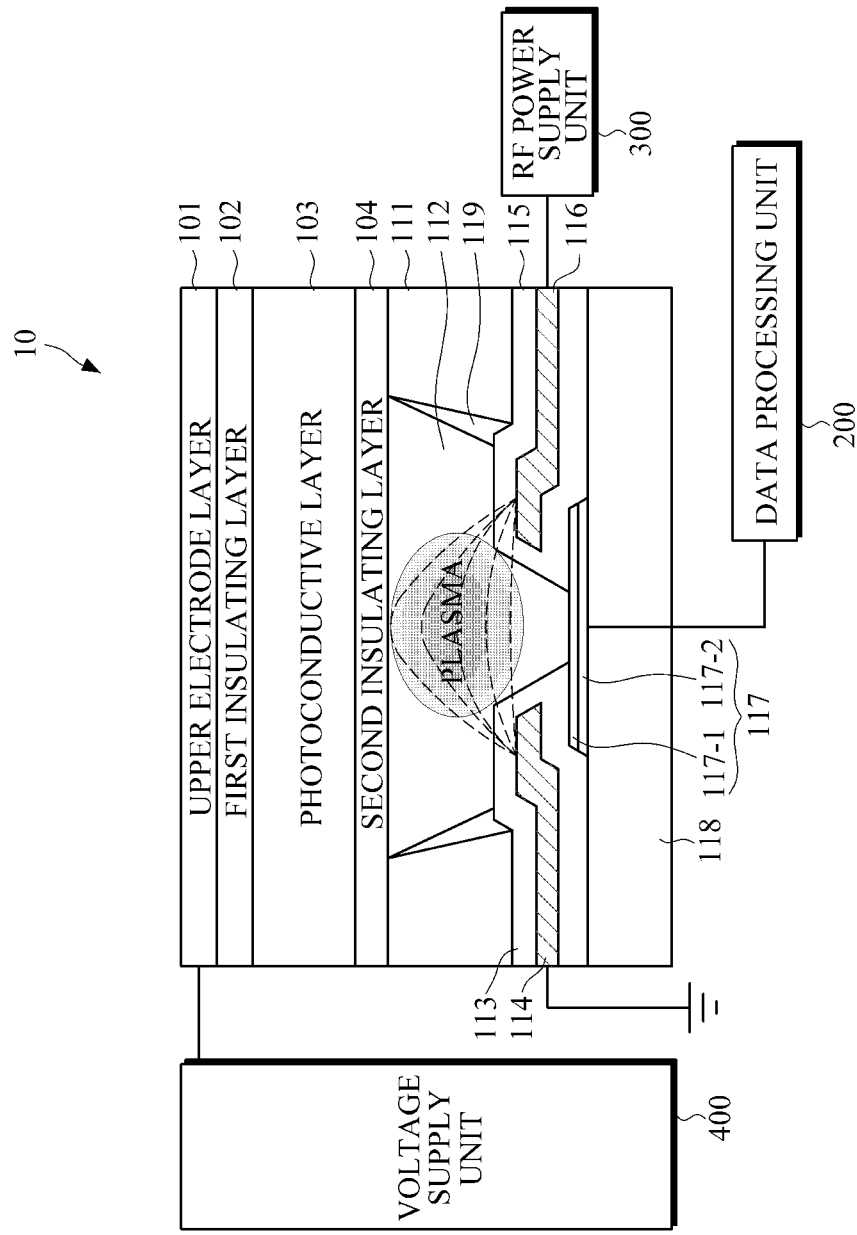

FIGS. 2A through 2C are cross-sectional views for explaining a radiation detection operation performed by the apparatus 10. Referring to FIG. 2A, radiation may be applied to the apparatus 10. The radiation may reach the photoconductive layer 103 through the upper electrode layer 101 and the first insulating layer 102. Due to the radiation, pairs of positive charge-negative charge pairs may be generated. The positive charges and the negative charges may move toward the upper electrode layer 101 and the second insulating layer 104, respectively, due to a high voltage applied to the upper electrode layer 101. For example, if a high-negative voltage is applied to the upper electrode layer 101, the negative charges generated in the photoconductive layer 103 may move toward the second insulating layer 104 and may thus accumulate between the photoconductive layer 103 and the second insulating layer 104.

Referring to FIG. 2B, when the RF power supply unit 300 supplies RF power to the second RF electrode 116, an electric field E may be generated between the first and second RF electrodes 114 and 116. Then, referring to FIG. 2C, plasma may be generated in the gas layer 112, and positive and thus, negative ions may be generated in the gas layer 112.

The positive or negative ions generated in the gas layer 112 may move toward the second insulating layer 104, and may thus accumulate in the bottom electrode 117. More specifically, if negative charges generated in the photoconductive layer 103 move toward the second insulating layer 104 and thus accumulate between the photoconductive layer 103 and the second insulating layer 104, negative ions may also accumulate in the bottom electrode 117. The data processing unit 200 may calculate the density of ions (i.e., either positive or negative ions) accumulated in the bottom electrode 117, and may generate a radiation image based on the result of the calculation. The radiation image may correspond to the density of ions accumulated in the bottom electrode 117 in response to the charges accumulated between the photoconductive layer 103 and the second insulating layer 104.

FIG. 3 is a flowchart of an example method of detecting radiation. Referring to FIGS. 1 and 3, when radiation is applied (310), positive and negative charges may be generated in the photoconductive layer 103 (320).

The positive and negative charges may be separated from each other due to a high voltage applied to the upper electrode layer 101. Then, the separated positive or negative charges may accumulate between the photoconductive layer 103 and the second insulating layer 104. For example, if a high negative voltage is applied to the upper electrode layer 101, negative charges may accumulate between the photoconductive layer 103 and the second insulating layer 104.

RF power may be applied to the second RF electrode 116 while applying a ground voltage to the first RF electrode 114. Then, plasma may be generated in the gas layer 112 (340).

Due to the generation of the plasma, either positive or negative ions may be generated in the gas layer 112, and the generated positive or negative ions may move to the bottom electrode 117 (350). If negative charges accumulate in the photoconductive layer 103 and the second insulating layer 104, negative ions may move toward the bottom electrode 117.

Thereafter, the density of positive or negative ions in the bottom electrode 117 may be read, and a radiation image may be generated based on the results of the reading (360).

Figure 4:
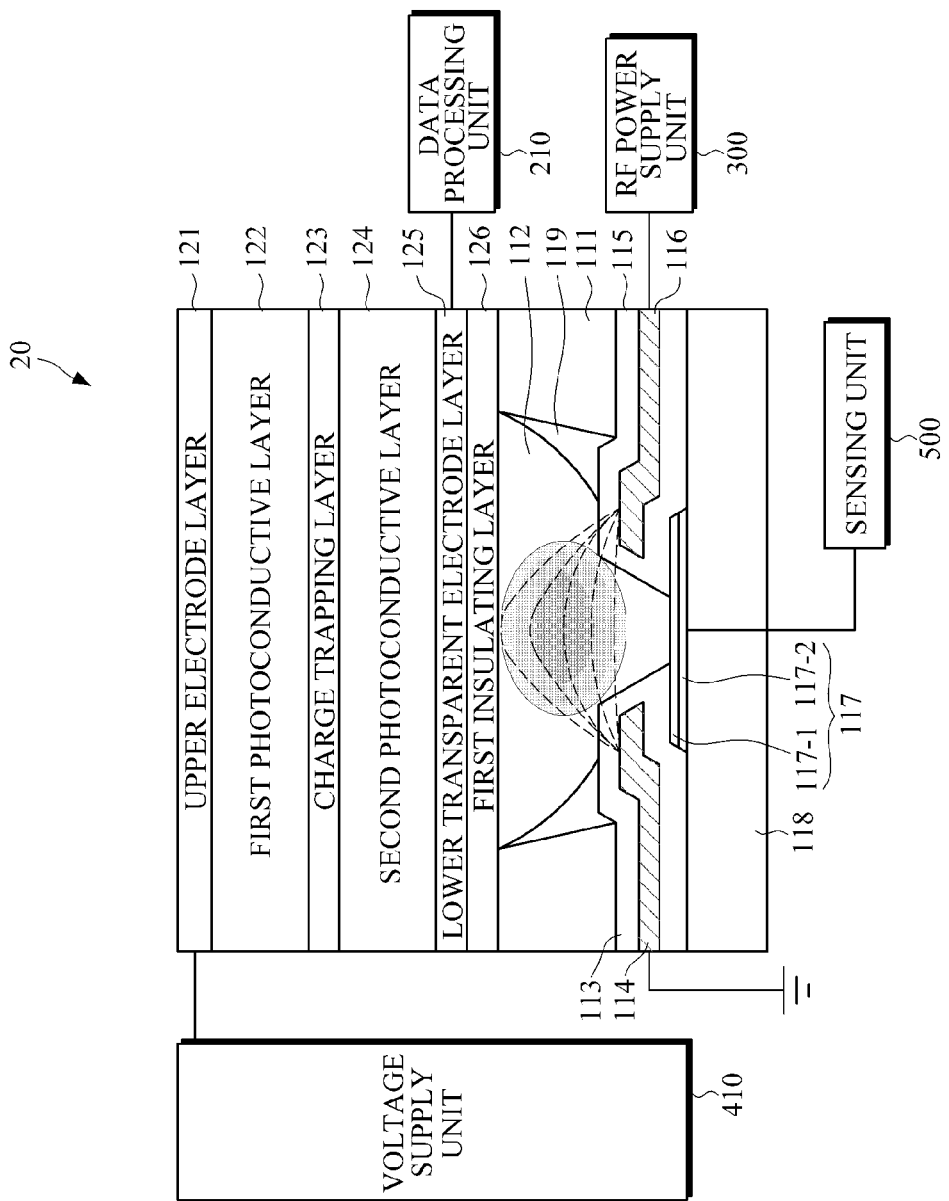
FIG. 4 is a cross-sectional view of another example apparatus for detecting radiation.

FIG. 4 is a cross-sectional view of another example apparatus 20 for detecting radiation. Referring to FIG. 4, the apparatus 20 may include an upper electrode layer 121, a first photoconductive layer 122, a charge trapping layer 123, a second photoconductive layer 124, a lower transparent electrode layer 125, a first insulating layer 126 and a plasma generator.

The upper electrode layer 121 may transmit radiation to the first photoconductive layer 122.

The first photoconductive layer 122 may become photoconductive upon exposure to the radiation transmitted by the upper electrode layer 121. The first photoconductive layer 122 may generate pairs of positive and negative charges (i.e., holes and electrons) upon exposure to the radiation transmitted by the upper electrode layer 121. The number of pairs of positive and negative charges generated by the first photoconductive layer 122 may be proportional to the intensity of the radiation transmitted to the first photoconductive layer 122. The amount of radiation that reaches the first photoconductive layer 122 may vary according to the composition of an object (such as the human body), if any, placed on the upper electrode layer 121. The first photoconductive layer 122 may be formed of a-Se, $As_2Se_3$ or an As-contained a-Se compound.

The charge trapping layer 123 may trap therein charges generated due to the photoconductivity of the first photoconductive layer 122 and may thus serve as a floating electrode. More specifically, the charge trapping layer 123 may block the charges generated in the first photoconductive layer 122 and may thus trap the corresponding charges between the first photoconductive layer 122 and the charge trapping layer 123. Even when blocked by the charge trapping layer 123, electrons can jump over an energy barrier between the first photoconductive layer 122 and the charge trapping layer 123 when the energy barrier becomes low due to, for example, a variation in an electric field or temperature outside the charge trapping layer 123. However, since a thickness $d_1$ of the first photoconductive layer 122 is much greater than a thickness $d_2$ of the second photoconductive layer 124 and thus the electric field applied to the first photoconductive layer 122 becomes much weaker than the electric field applied to the second photoconductive layer 124, there is no sufficient external energy for the charges generated in the first photoconductive layer 122 to jump over the energy barrier. Thus, the charges generated in the first photoconductive layer 122 can be effectively blocked by the charge trapping layer 103.

In order to properly trap charges generated upon exposure to radiation in the charge trapping layer 123, the charge trapping layer 123 may be formed as a metal layer, a dielectric layer or the combination thereof.

More specifically, the charge trapping layer 123 may be formed as a metal layer by using silver (Ag), copper (Cu), gold (Au), aluminum (Al), calcium (Ca), tungsten (W), zinc (Zn), nickel (Ni), iron (Fe), platinum (Pt), tin (Sn), lead (Pb), manganese (Mn), constantan, mercury (Hg), nichrome, carbon (C), germanium (Ge), silicon (Si), glass, quartz, polyethylene terephtalate (PET), or Teflon. Alternatively, the charge trapping layer 123 may be formed as a dielectric layer by using an organic dielectric material such as benzocyclobutene (BCB), parylene, a-C:H(F), polyimide (PI), polyarylene ether, or fluorinated amorphous carbon, an inorganic dielectric material such as $SiO_2$, $Si_3N_4$, polysilsequioxane, or methyl silane, or a porous dielectric material such as xetogel/aerogel or polycaprolactone (PCL). By forming the charge trapping layer 123 as a metal layer, a dielectric layer or the combination thereof, it is possible to simplify the fabrication of the charge trapping layer 123, effectively trap the charges generated in the first photoconductive layer 122 in the charge trapping layer 123 and reduce the time and cost required to manufacture the apparatus 20, compared to the case when the charge trapping layer 123 is formed of doped semiconductor.

The second photoconductive layer 124 may become photoconductive upon exposure to rear light for reading out a radiation image. That is, the second photoconductive layer 124 may generate pairs of positive and negative charges upon exposure to rear light. The amount of positive and negative charges generated in the second photoconductive layer 124 may be proportional to the intensity of rear light transmitted to the second photoconductive layer 124. The second photoconductive layer 124 may be formed of a-Se, $As_2Se_3$ or an As-contained a-Se compound.

The lower transparent electrode layer 125 may be charged with the charges trapped in the charge trapping layer 123. The lower transparent electrode layer 125 may be formed of a transparent material and may thus be able to properly transmit rear light (i.e., plasma light) therethrough to the second photoconductive layer 124. For example, the lower transparent electrode layer 125 may be formed of a transparent material such as indium tin oxide (ITO) or indium zinc oxide (IZO). If pairs of positive and negative charges are generated in the second photoconductive layer 124 upon exposure to rear light, the lower transparent electrode layer 125 may be charged with the opposite polarity to that of the charges trapped in the charge trapping layer 123.

A data processing unit 210 may read out a signal corresponding to the charges in the lower transparent electrode layer 125 from the lower transparent electrode layer 125, and may thus generate a radiation image based on the read-out signal. FIG. 4 illustrates the structure of a portion of the apparatus 20 corresponding to a pixel in the plasma generator. Thus, the data processing unit 210 may perform the reading out of the signal in units of pixels or rows or columns of pixels in a pixel array in the plasma generator and may thus generate a whole radiation image.

The first insulating layer 126 may protect the lower transparent electrode layer 125 from a plasma discharge. The plasma generator may be the same as its counterpart shown in FIG. 1 in terms of structure and operation. More specifically, the plasma generator, like the plasma generator shown in FIG. 1, may include a plurality of barrier ribs 111, a gas layer 112, first and second RF electrodes 114 and 116, third insulating layers 113 and 115, a bottom electrode 117, a lower substrate 118 and a phosphor layer 119.

The lower substrate 118 may face the first insulating layer 126. The barrier ribs 111 may define a cell structure between the first insulating layer 126 and the lower substrate 118. The gas layer 112 may be disposed in an inner chamber within the cell structure, and may generate a plasma discharge. The bottom electrode 117 may be disposed on the lower substrate 118. The third insulating layers 113 and 115 may surround the first and second RF electrodes 114 and 116, respectively, and may thus insulate the first and second RF electrodes 114 and 116 from the gas layer 112 and the bottom electrode 117. The first and second RF electrodes 114 and 116 may be formed on the bottom electrode 117. A ground voltage may be applied to the first RF electrode 114, and RF power may be supplied to the second RF electrode 116 so as for the second RF electrode 116 to generate plasma in the gas layer 112. The phosphor layer 119 may extend to the third insulating layers 113 and 115, and may surround the gas layer 112 along the barrier ribs 111. The phosphor layer 119 may be optional.

The data processing unit 210 may be connected to the lower transparent electrode layer 125. The data processing unit 210 may read out a signal corresponding to the charges in the lower transparent electrode layer 125 and may generate a radiation image based on the read-out signal.

An RF power supply unit 300 may supply RF power to the second RF electrode 116. More specifically, the RF power supply unit 300 may supply an RF power of, for example, 2 kW (frequency: 13.56 MHz), to the second RF electrode 116 during an image sensing period for reading out a radiation image. After the image sensing period, the RF power supply unit 300 may also supply RF power to the second RF electrode 116 in order to reset the photoconductive layer 103. In this manner, by using plasma light, it is possible to not only perform radiation imaging but also reset the second photoconductive layer 124.

The RF power supply unit 300 may control the intensity of rear light, i.e., plasma light, by adjusting the level of RF power to be supplied to the second RF electrode 116. The RF power supply unit 300 may also control the duration of exposure to plasma light, which is generated upon the supply of RF power. Therefore, the RF power supply unit 300 can control the amount of plasma light generated, by appropriately controlling the intensity of plasma light and the duration of exposure to the plasma light.

A voltage supply unit 400 may apply a high voltage or a ground voltage to the upper electrode layer 101 according to the type of operation performed by the apparatus 10.

A sensing unit 500 may be connected to the bottom electrode 117, and may calculate the density of positive or negative ions generated upon the generation of plasma in the gas layer 112. The data processing unit 210, like the data processing unit 200 shown in FIG. 1, may be provided with an oscillation frequency detected from the quartz layer 117-1 during a predetermined sensing period, may determine the oscillation period of a resonant frequency generated in the quartz layer 117-1, and may calculate the density of ions colliding with the quartz layer 117-1 based on the result of the determination.

However, the apparatus 20 is different from the apparatus 10 shown in FIG. 1 in that the data processing unit 210 calculates the density of all ions (regardless of whether positive or negative) in the gas layer 112 that collide with the bottom electrode 117, whereas the data processing unit 200 of the apparatus 10 calculates the density of either positive or negative ions accumulated in the bottom electrode 117.

In order to electrically neutralize or reset the second photoconductive layer 124, the RF power supply unit 300 may appropriately adjust the level of its RF power based on the brightness of an image provided by the data processing unit 210, and may thus apply RF power to the second RF electrode according to the results of the adjustment. For this, the RF power supply unit 300 and the data processing unit 210 may be configured to be able to communicate with each other.

FIG. 4 illustrates the structure of a portion of the apparatus 20 corresponding to a pixel in the plasma generator. Since the amount of radiation absorbed by each pixel varies according to the brightness of a corresponding pixel, the amount of rear light required to reset the second photoconductive layer 124 may vary from one pixel to another. Thus, the RF power supply unit 300 may adjust the level of RF power and the duration of exposure to plasma light in units of pixels based on pixel brightness measurements provided by the data processing unit 210 such that a smaller amount of rear light can be applied to pixels with a low brightness level than pixels with a high brightness level.

In this manner, it is possible to reduce the time taken to reset the apparatus 20 between two successive image capturing operations by adjusting, in units of pixels, the amount of plasma light irradiated on the photoconductive layer 103 for resetting the photo conductive layer 103. In addition, it is possible to prevent the second photoconductive layer 124 from being exposed to too much plasma light and thus to prevent the life span of the second photoconductive layer 124 from decreasing due to cumulative fatigue.

Figure 5A:
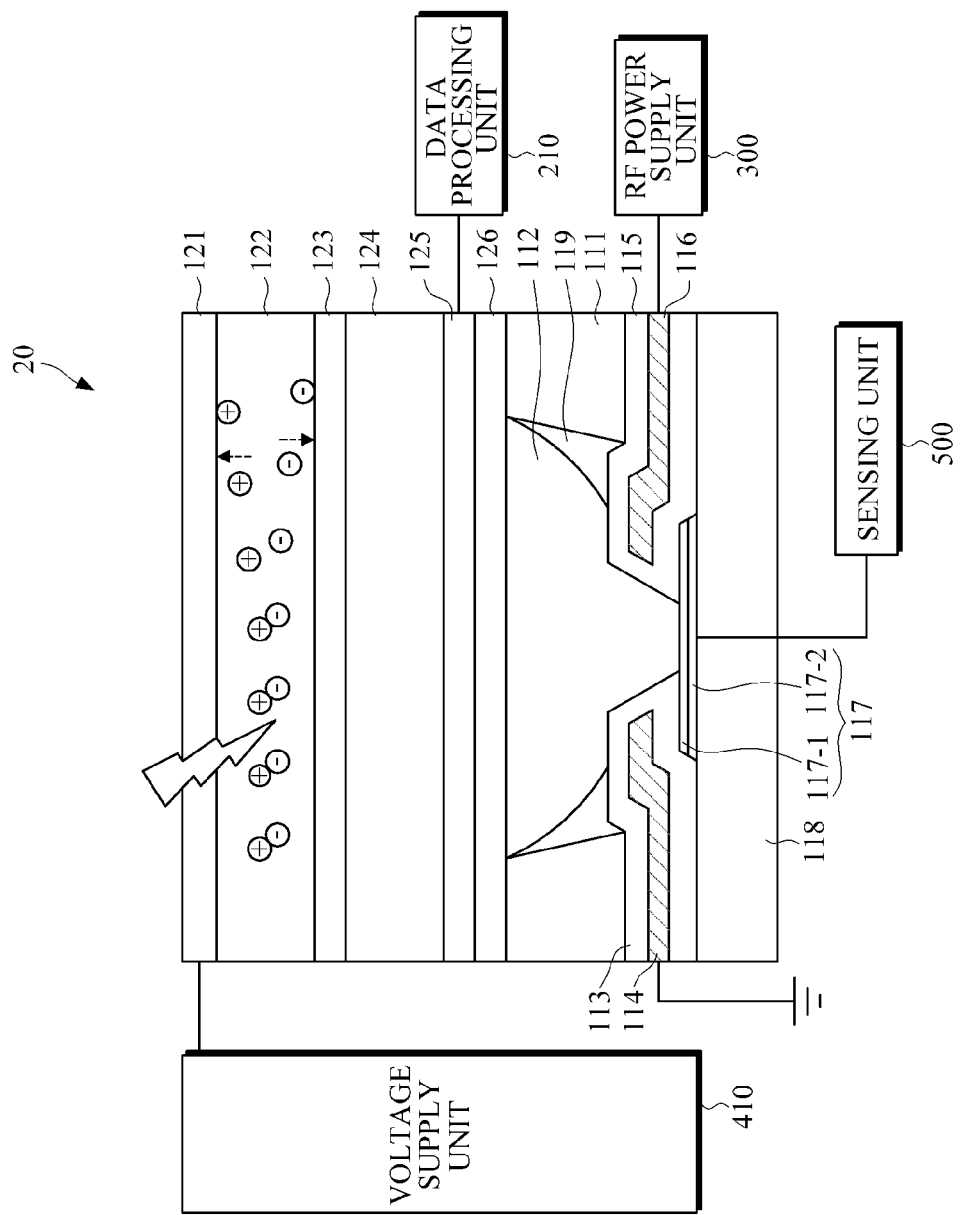

FIGS. 5A through 5D are cross-sectional views for a radiation detection operation performed by the apparatus 20. Referring to FIG. 5A, when radiation such as X-rays is applied to the apparatus 20, the radiation may reach the first photoconductive layer 122 through the upper electrode layer 121, and pairs of positive and negative charges may be generated in the first photoconductive layer 122. Then, if a high voltage is applied to the upper electrode layer 121, the positive and negative charges may be separated from each other. More specifically, if a high negative voltage is applied to the upper electrode layer 121, the positive charges may move toward the upper electrode layer 121, and the negative charges may move toward the charge trapping layer 123.

Figure 5B:
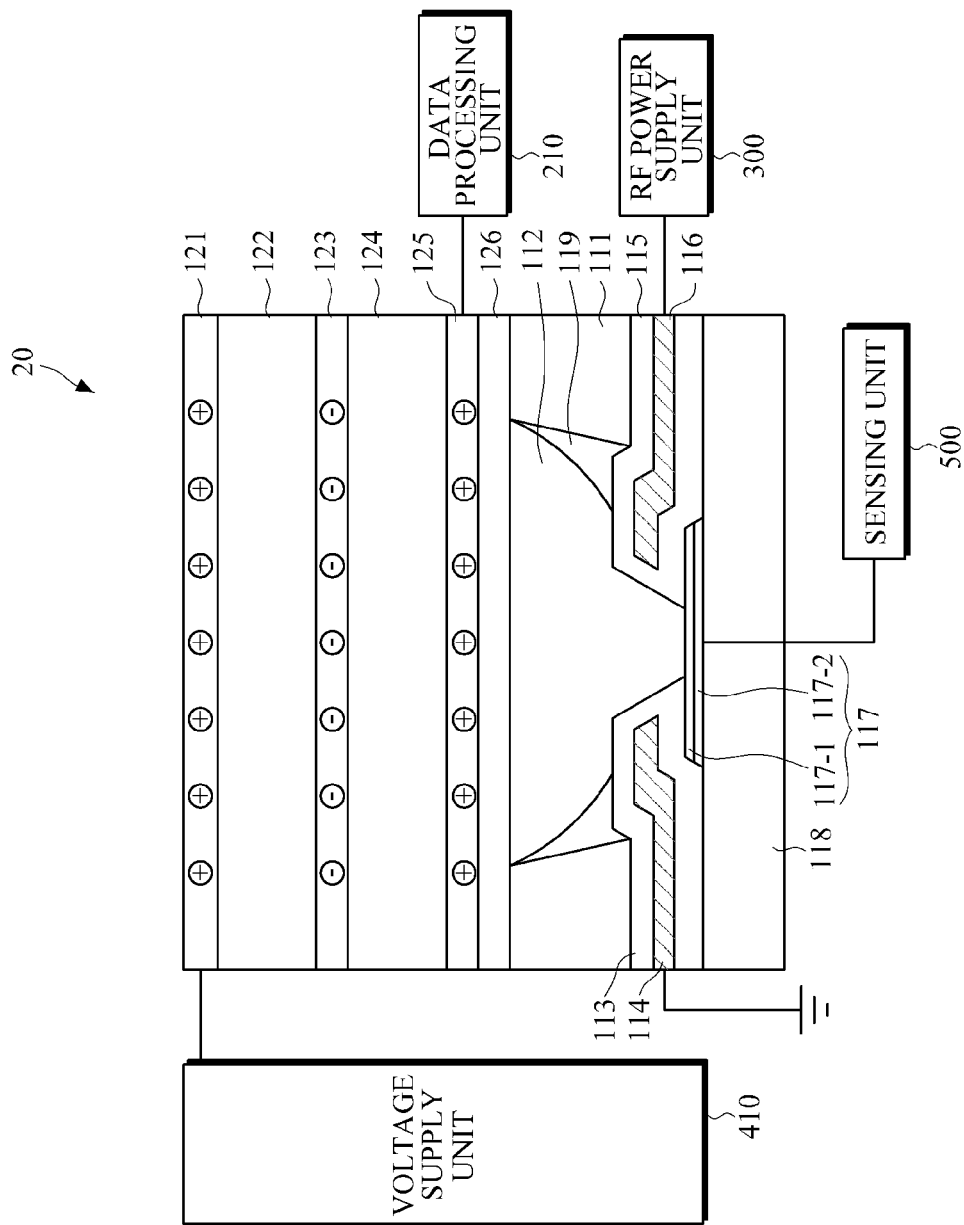

Referring to FIG. 5B, the charge trapping layer 123 may trap therein the negative charges moving theretoward. More specifically, the negative charges generated in the first photoconductive layer 122 may accumulate at the interface between the first photoconductive layer 122 and the charge trapping layer 123. The negative charges accumulated in the charge trapping layer 123 may be blocked by an electric field applied to the first photoconductive layer 122.

Assume that the charge trapping layer 123 is a metal layer.

Since the amount of radiation transmitted through an object (such as the human body), if any, placed on the apparatus 20 varies according to the composition and shape of the object, the amount of positive and negative charges generated in the upper electrode layer 121 and the amount of negative charges trapped in the charge trapping layer 123 may also vary according to the composition and shape of the object. Therefore, the amount of negative charges trapped in the charge trapping layer 123 may correspond to a radiation image recorded by the apparatus 20.

Once negative charges are trapped in the charge trapping layer 123, the second photoconductive layer 124 can serve as a capacitor. As a result, referring to FIG. 5B, the lower transparent electrode layer 125 may be charged with positive charges. More specifically, the lower transparent electrode layer 125 may be charged with a number of positive charges corresponding to the number of negative charges trapped in the charge trapping layer 123. When the above-mentioned radiation image recording operation is complete, the application of a high voltage to the upper electrode layer 121 may be terminated, and a ground voltage may be applied to the upper electrode layer 121.

Thereafter, a radiation image read-out operation may be performed. The radiation image read-out operation will hereinafter be described in detail with reference to FIGS. 5C and 5D.

Referring to FIG. 5C, when the RF power supply unit 300 supplies RF power to the second RF electrode 116, plasma light may be generated in the gas layer 112. The generated plasma light, which is rear light, may reach the second photoconductive layer 124 through the lower transparent electrode layer 125.

More specifically, if the RF power supply unit 300 supplies RF power to the second RF electrode 116 while applying a ground voltage to the first RF electrode 114, an electric field E may be generated between the first and second RF electrodes 114 and 116. Due to the electric field E, plasma may be generated in the gas layer 112, and thus, positive and negative ions may also be generated in the gas layer 112. The second photoconductive layer 124 may generate pairs of positive and negative charges upon exposure to the plasma light.

Referring to FIG. 5D, once negative charges generated in the second photoconductive layer 124 are read out due to the positive charges in the lower transparent electrode layer 115, the image processing unit 210 may perform image processing by reading out the negative charges in the second photoconductive layer 124. The positive charges in the second photoconductive layer 124 may move toward the charge trapping layer 123 due to the negative charges trapped in the charge trapping layer 123, and thus, the charge trapping layer 123 may be electrically neutralized.

Figure 6:
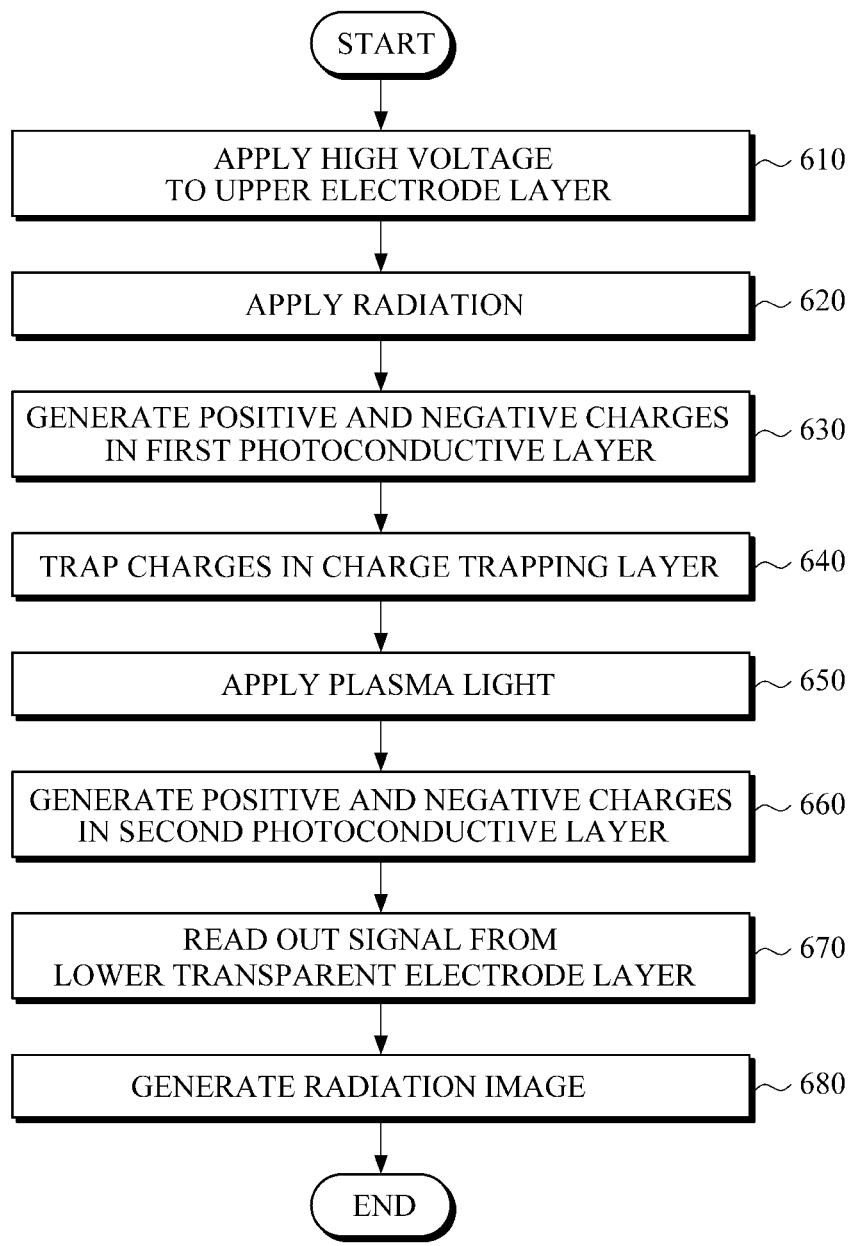
FIG. 6 is a flowchart of another example method of detecting radiation.

FIG. 6 is a flowchart of another example method of detecting radiation. Referring to FIGS. 4 and 6, a high voltage may be applied to the upper electrode layer 121 (610), and radiation may be applied to the apparatus 20 (620). Then, pairs of positive and negative charges may be generated in the first photoconductive layer 122 upon exposure to the radiation (630).

The positive and negative charges may be separated from each other and may thus move toward the upper electrode layer 121 and the charge trapping layer 123, respectively. As a result, either positive or negative charges may accumulate and may be trapped in the charge trapping layer 123 (640).

When the above-mentioned radiation image recording operation is complete, a radiation image read-out operation may be performed. More specifically, when the radiation image recording operation is complete, the application of a high voltage to the upper electrode layer 121 may be terminated, and a ground voltage may be applied to the upper electrode layer 121. Thereafter, plasma light may be generated by applying RF power to the second RF electrode 116 while applying the ground voltage to the first RF electrode 114. Then, the plasma light may be applied toward the second photoconductive layer 124 as rear light (650).

Due to the plasma light, pairs of positive and negative charges may be generated in the second photoconductive layer 124 (660).

Thereafter, a signal corresponding to the charges transmitted from the second photoconductive layer 124 to the lower transparent electrode layer 125 in connection with the charges trapped in the charge trapping layer 123 may be read out from the lower transparent electrode layer 125 (670). Thereafter, the data processing unit 210 may generate a radiation image based on the read-out signal (680).

Figure 7:
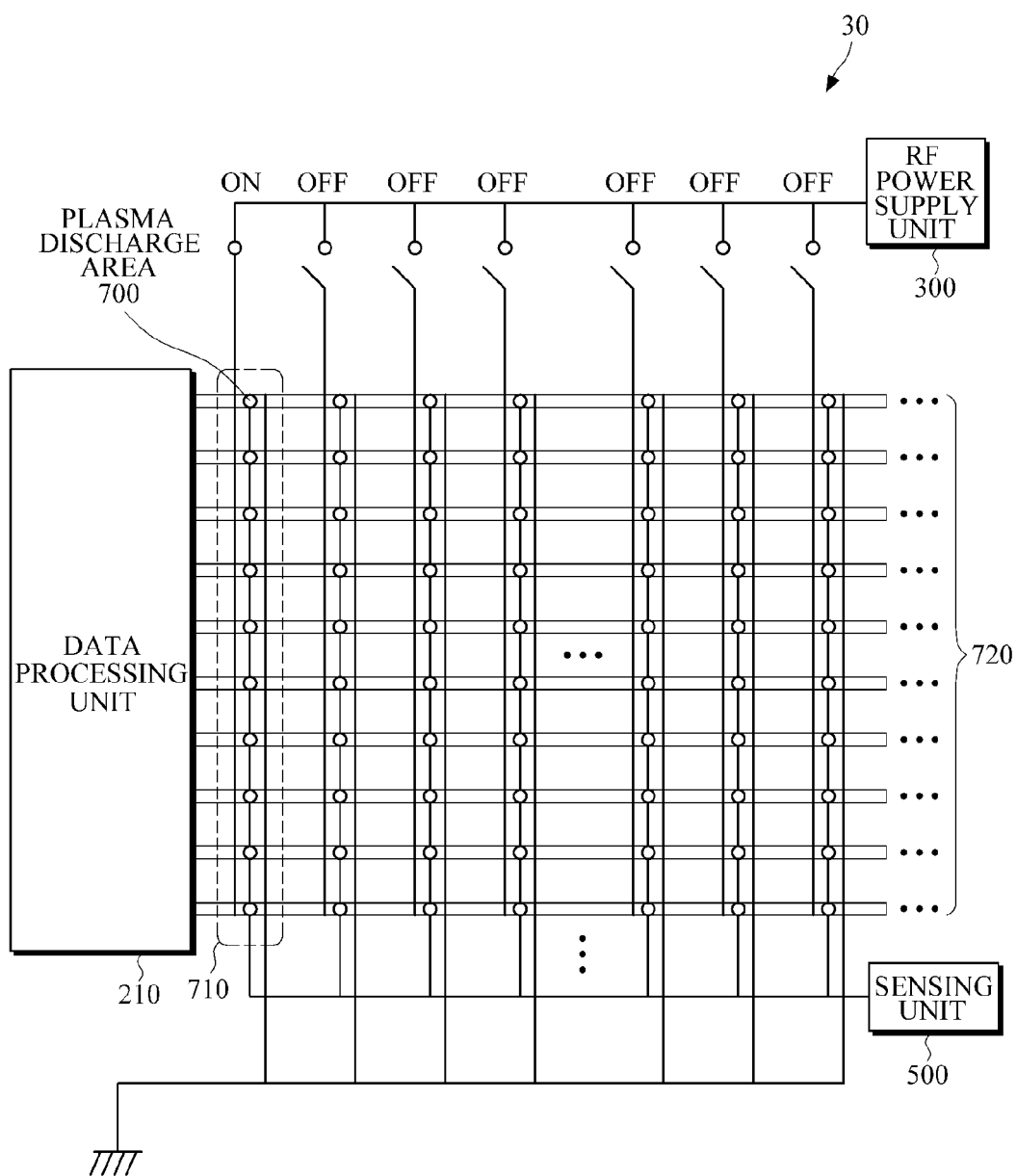
FIG. 7 is a schematic view for explaining a radiation image read-out operation, which is performed by another example apparatus for detecting radiation.

FIG. 7 is a schematic view for explaining a radiation image read-out operation performed by another example apparatus 30 for detecting radiation. The apparatus 30 may have the same structure as the apparatus shown in FIG. 4. Referring to FIG. 7, first and second RF electrodes (not shown) may be connected to each plasma discharge area 700. An RF power supply unit 300 may supply RF power to each of a plurality of rows of pixels in a pixel array 720, and thus, a partial radiation image may be read out from each of the rows of pixels in the pixel array 720, thereby obtaining a radiation image for the whole pixel array 720.

For example, if a first row 710 of pixels is turned on in response to RF power supplied thereto, plasma light may be emitted from the first pixel row 710, and a partial radiation image for the first pixel row 710 may be read out from the lower transparent electrode layer 125 using the plasma light. Thereafter, the supply of RF power to the first pixel row 710 may be terminated, and RF power may be supplied to a second row of pixels. In this manner, it is possible to obtain a radiation image for the whole pixel array 720.

The apparatus 30 may have the same structure as the apparatus 10 shown in FIG. 1 for each pixel. In this case, a data processing unit 210 of the apparatus 30, like the data processing unit 200 shown in FIG. 1, may be connected to a bottom electrode (not shown), and the apparatus 30 may not include a sensing unit 500.

According to the present invention, it is possible to improve the resolution of a radiation image and simplify the manufacture of an apparatus for detecting radiation by reading out a radiation image using plasma light. In addition, it is possible to generate a radiation image using a simple electrode structure for generating plasma. Moreover, it is possible to not only read out a radiation image but also effectively reset a photoconductive layer using plasma light.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An apparatus for detecting radiation, the apparatus comprising:
   an upper electrode layer transmitting radiation;
   a first insulating layer blocking charges from the upper electrode layer;
   a photoconductive layer becoming photoconductive upon exposure to the radiation;
   a second insulating layer protecting the photoconductive layer from a plasma discharge;
   a lower substrate facing the second insulating layer;
   a plurality of barrier ribs defining a cell structure between the second insulating layer and the lower substrate;
   a gas layer included in an inner chamber inside the cell structure and generating a plasma discharge;
   a bottom electrode formed on the lower substrate;
   a first radio frequency (RF) electrode formed over the bottom electrode and connected to a ground source;
   a second RF electrode to which RF power for generating plasma is applied; and
   a third insulating layer surrounding the first and second RF electrodes and thus insulating the first and second RF electrodes from the gas layer and the bottom electrode.

2. The apparatus of claim 1, wherein pairs of positive and negative charges may be generated in the photoconductive layer in response to the radiation and the positive and negative charges are separated from each other in response to a high voltage applied to the upper electrode layer.

3. The apparatus of claim 1, wherein positive and negative ions are generated in the gas layer in response to the RF power and either the positive or negative ions accumulate in the bottom electrode due to positive or negative charges moving toward the second insulating layer.

4. The apparatus of claim 3, further comprising a data processing unit connected to the bottom electrode, the data processing unit calculating a density of positive or negative ions accumulated in the bottom electrode and generating a radiation image based on the results of the calculation.

5. The apparatus of claim 4, wherein the bottom electrode comprises a quartz layer contacting the gas layer and an electrode layer contacting the lower substrate and the data processing unit calculates a density of positive or negative ions accumulated in the bottom electrode based on an oscillation frequency of a resonant frequency, which is generated in a quartz layer of the bottom electrode, and generates a radiation image based on the results of the calculation.

6. A method of detecting radiation, which is an operating method of an apparatus for detecting radiation, including an upper electrode layer transmitting radiation, a first insulating layer blocking charges from the upper electrode layer, a photoconductive layer becoming photoconductive upon exposure to the radiation, a second insulating layer protecting the photoconductive layer from a plasma discharge, a lower substrate facing the second insulating layer, a plurality of barrier ribs defining a cell structure between the second insulating layer and the lower substrate, a gas layer included in an inner chamber inside the cell structure and generating a plasma discharge, a bottom electrode formed on the lower substrate, a first RF electrode formed over the bottom electrode and connected to a ground source, a second RF electrode to which RF power for generating plasma is applied and a third insulating layer surrounding the first and second RF electrodes and thus insulating the first and second RF electrodes from the gas layer and the bottom electrode, the method comprising:

generating pairs of positive and negative charges in the photoconductive layer upon exposure to the radiation;

accumulating the positive or negative charges between the photoconductive layer and the second insulating layer in response to a high voltage applied to the upper electrode layer;

generating plasma in the gas layer in response to RF power to the second RF electrode;

allowing positive or negative ions, which are generated due to the plasma generated in the gas layer, to accumulate in the bottom electrode in response to the positive or negative charges accumulated between the photoconductive layer and the second insulating layer; and reading a density of positive or negative ions accumulated in the bottom electrode.

7. The method of claim 6, wherein the reading of the density of positive or negative ions accumulated in the bottom electrode comprises calculating the density of positive or negative ions accumulated in the bottom electrode based on an oscillation frequency of a resonant frequency, which is generated in a quartz layer of the bottom electrode, and generating a radiation image based on the results of the calculation.

8. The method of claim 6, further comprising, after the reading of the density of positive or negative ions accumulated in the bottom electrode, applying RF power to the second RF electrode in order to reset or electrically neutralize the photoconductive layer.

9. An apparatus for detecting radiation, the apparatus comprising:
an upper electrode layer transmitting radiation;
a first photoconductive layer becoming photoconductive upon exposure to the radiation;
a charge trapping layer trapping charges generated in the first photoconductive layer;
a second photoconductive layer becoming photoconductive upon exposure to rear light;
a lower transparent electrode layer charged with the charges trapped in the charge trapping layer and used to read out charges generated in the second photoconductive layer;
a first insulating layer protecting the lower transparent electrode layer from a plasma discharge;
a lower substrate facing the first insulating layer;
a plurality of barrier ribs defining a cell structure between the second insulating layer and the lower substrate;
a gas layer included in an inner chamber inside the cell structure and generating a plasma discharge;
a bottom electrode formed on the lower substrate;
a first RF electrode formed over the bottom electrode and connected to a ground source;
a second RF electrode to which RF power for generating plasma is applied; and
a third insulating layer surrounding the first and second RF electrodes and thus insulating the first and second RF electrodes from the gas layer and the bottom electrode.

10. The apparatus of claim 9, further comprising a data processing unit connected to the lower transparent electrode layer, the data processing unit generating a radiation image using a signal corresponding to an amount of charges read out from the lower transparent electrode layer.

11. The apparatus of claim 10, further comprising an RF power supply unit supplying RF power to the second RF electrode,
wherein the RF power supply unit adjusts a level of RF power to be supplied to the second RF electrode based on a brightness level of each pixel of the radiation image in order to electrically neutralize the second photoconductive layer.

12. The apparatus of claim 9, further comprising a sensing unit connected to the bottom electrode, the sensing unit measuring a density of positive or negative ions accumulated in the bottom electrode due to the plasma discharge generated in the gas layer.

13. The apparatus of claim 12, wherein the bottom electrode comprises a quartz layer contacting the gas layer and an electrode layer contacting the lower substrate and the sensing unit calculates the density of positive or negative ions accumulated in the bottom electrode using an oscillation period of a resonant frequency, which is generated in the quartz layer, and generates a radiation image based on the results of the calculation.

14. The apparatus of claim 9, wherein the charge trapping layer includes a metal, a dielectric material or the combination of a metal and a dielectric material.

15. A method of detecting radiation, which is an operating method of an apparatus for detecting radiation, including an upper electrode layer transmitting radiation, a first photoconductive layer becoming photoconductive upon exposure to the radiation, a charge trapping layer trapping therein charges generated in the first photoconductive layer, a second photoconductive layer becoming photoconductive upon exposure to rear light, a lower transparent electrode layer charged with the charges trapped in the charge trapping layer and used to read out charges generated in the second photoconductive layer, a first insulating layer protecting the lower transparent electrode layer from a plasma discharge, a lower substrate facing the first insulating layer, a plurality of barrier ribs defining a cell structure between the second insulating layer and the lower substrate, a gas layer included in an inner chamber inside the cell structure and generating a plasma discharge, a bottom electrode formed on the lower substrate, a first RF electrode formed over the bottom electrode and connected to a ground source, a second RF electrode to which RF power for generating plasma is applied, and a third insulating layer surrounding the first and second RF electrodes and thus insulating the first and second RF electrodes from the gas layer and the bottom electrode, the method comprising:

generating pairs of positive and negative charges in the first photoconductive layer upon exposure to the radiation when a high voltage is applied to the upper electrode layer;

separating the positive and negative charges from each other by moving the positive and negative charges toward the upper electrode and the charge trapping layer, respectively;

trapping the positive or negative charges in the charge trapping layer;

generating plasma light by applying RF power to the second RF electrode;

generating pairs of positive and negative charges in the second photoconductive layer upon exposure to the plasma light;

reading out a signal corresponding to charges transmitted from the second photoconductive layer to the lower transparent electrode layer in connection with the charges trapped in the charge trapping layer from the lower transparent electrode layer; and generating a radiation image based on the read-out signal.

16. The method of claim 15, further comprising calculating the density of positive or negative ions accumulated in the bottom electrode due to the generation of plasma in the gas layer based on an oscillation period of a resonant frequency, which is generated in a quartz layer of the bottom electrode.

17. The method of claim 15, further comprising adjusting a level of RF power to be supplied to the second RF electrode based on a brightness level of each pixel of the radiation image and applying RF power to the second RF electrode according to the results of the adjustment in order to electrically neutralize the second photoconductive layer.

* * * * *